US009647085B2

(12) United States Patent
Huang et al.

(10) Patent No.: US 9,647,085 B2
(45) Date of Patent: May 9, 2017

(54) CMOS DEVICE WITH DOUBLE-SIDED TERMINALS AND METHOD OF MAKING THE SAME

(71) Applicant: Semiconductor Manufacturing International (Shanghai) Corporation, Shanghai (CN)

(72) Inventors: Herb He Huang, Shanghai (CN); Haiting Li, Shanghai (CN); Qiang Zhou, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/069,290

(22) Filed: Oct. 31, 2013

(65) Prior Publication Data
US 2014/0367753 A1 Dec. 18, 2014

(30) Foreign Application Priority Data
Jun. 18, 2013 (CN) .......................... 2013 1 0242364

(51) Int. Cl.
*H01L 23/522* (2006.01)
*H01L 21/768* (2006.01)
(Continued)

(52) U.S. Cl.
CPC .. *H01L 29/66477* (2013.01); *H01L 21/76898* (2013.01); *H01L 21/823814* (2013.01);
(Continued)

(58) Field of Classification Search
CPC ... H01L 23/48; H01L 23/49811; H01L 24/83; H01L 25/0657; H01L 21/8232; H01L 21/823418; H01L 21/28; H01L 21/283; H01L 21/336768; H01L 21/76825; H01L 21/76828; H01L 21/8234; H01L 2224/73265; H01L 2224/29299; H01L 2224/48247; H01L 2224/49111; H01L 2224/92247; H01L 31/0296; H01L 31/392; H01L 23/10; H01L 23/34; H01L 23/481; H01L 27/01; H01L 27/12; H01L 27/14636; H01L 2924/19107; H01L 29/66477;
(Continued)

(56) References Cited

U.S. PATENT DOCUMENTS 6,483,147 B1 * 11/2002 Lin .................. H01L 21/743
257/347
7,560,758 B2 * 7/2009 Zhu et al. ..................... 257/288
(Continued)

*Primary Examiner* — Natalia Gondarenko
(74) *Attorney, Agent, or Firm* — Kilpatrick Townsend and Stockton LLP

(57) ABSTRACT

A transistor device includes a semiconductor substrate having a first surface and a second surface opposite the first surface, a gate structure disposed on the first surface and configured to form a channel region, and source and drain regions disposed on opposite sides of the channel region. The device also includes a source terminal and a drain terminal disposed on the second surface. The source and drain terminals are connected to the respective source and drain regions. The transistor device further include a body terminal disposed on the second surface and configured to connect the highest or lowest voltage supply to the semiconductor substrate.

9 Claims, 14 Drawing Sheets

(51) Int. Cl.
*H01L 29/66* (2006.01)
*H01L 21/8238* (2006.01)
*H01L 23/48* (2006.01)
*H01L 29/78* (2006.01)
*H01L 21/762* (2006.01)

(52) U.S. Cl.
CPC .... *H01L 21/823871* (2013.01); *H01L 23/481* (2013.01); *H01L 21/76224* (2013.01); *H01L 2924/0002* (2013.01)

(58) Field of Classification Search
CPC . H01L 29/78; H01L 29/0847; H01L 29/1079; H01L 29/4232; H01L 29/66325; H01L 21/02016; H01L 21/768; H01L 21/76886; H01L 21/76897; H01L 21/823475; H01L 21/823871; H01L 21/76802; H01L 23/53209; H01L 23/528; H01L 23/5226; H01L 23/5384; H01L 2224/1405; H01L 2224/14051; H01L 2224/141; H01L 2224/1605; H01L 2224/161; H01L 2224/2505; H01L 2224/2901; H01L 2224/3005; H01L 2224/301; H01L 2224/3205; H01L 2224/321; H01L 2224/3305; H01L 2224/37011; H01L 2224/331; H01L 2224/4005; H01L 2224/401; H01L 2224/4501; H01L 2224/4502; H01L 2224/4805; H01L 2224/481; H01L 2225/06548; H01L 25/50; H01L 2924/0002; H01L 21/76877; H01L 21/76843; H01L 21/76224
USPC .......... 257/288, 447, 28, 692, 777; 438/197, 438/149, 157, 217, 27, 129, 301, 622, 438/637, 666
See application file for complete search history.

(56) References Cited

U.S. PATENT DOCUMENTS 8,748,245 B1* 6/2014 Stuber et al. .................. 438/197
2007/0296002 A1* 12/2007 Liang et al. ................... 257/288
2012/0126394 A1* 5/2012 Huang .......................... 257/737

* cited by examiner

CMOS DEVICE WITH DOUBLE-SIDED TERMINALS AND METHOD OF MAKING THE SAME

CROSS-REFERENCES TO RELATED APPLICATIONS

This application claims priority to Chinese Patent Application No. 201310242364.6, filed Jun. 18, 2013, entitled "CMOS DEVICE WITH DOUBLE-SIDED TERMINALS AND METHOD OF MAKING THE SAME," commonly assigned and incorporated herein by reference in its entirety.

BACKGROUND OF THE INVENTION

The present invention relates to semiconductor technology, and more particularly to an MOS transistor, MOS integrated circuit device, and manufacturing method for reducing coupling capacitance between a gate electrode and source/drain electrodes.

Metal oxide semiconductor field effect transistor devices (MOSFETs) formed in a semiconductor substrate are widely used in integrated circuit devices (ICs). Typically, a FET transistor device includes a gate structure configured to form a channel region, and a source region and a drain region disposed on opposite sides of the channel region. The gate structure, the source and drain regions are connected to associated terminals that are disposed on the same side of the semiconductor substrate.

As technology nodes shrink in IC designs, transistor devices are continuously getting smaller, the spacing between the gate electrodes, and the source/drain electrodes continues to decrease, resulting in an increase of coupling capacitance between the gate and source/drain electrodes. Because the contacts openings of the source and drain electrodes and the gate contact opening disposed between them are disposed on the same side of the semiconductor substrate, such structures increase the coupling capacitance between the gate electrode and the source/drain electrodes.

The increase in coupling capacitance between the gate and source/drain electrodes adversely affects the performance of a transistor device, which, in turn, affects the performance of an integrated circuit device having such a transistor device. While the prior art fin-type field effect transistor (Fin FET) may somewhat reduce coupling capacitive effects, however, as feature sizes continue to shrink, conventional techniques may become inefficient in reducing coupling capacitance between gate and source/drain electrodes.

Therefore, it would be beneficial, both to circuit and device performance and to manufacturing economies, if the source/drain electrodes were to be placed on an opposite side of the gate electrode to reduce coupling capacitance.

BRIEF SUMMARY OF THE INVENTION

Embodiments of the present invention provide a MOS transistor device having a novel structure, an integrated circuit having such a transistor device, and a method of manufacturing such transistor device and integrated circuit device. In accordance with one advantageous embodiment, a transistor device includes a semiconductor substrate that has a first surface and a second surface opposite the first surface. A gate structure is disposed on the first surface of the semiconductor substrate and configured to form a channel region in the substrate. A source region and a drain region are disposed in the semiconductor substrate on opposite sides of the channel region. The transistor device also includes a source connection terminal and a drain connection terminal disposed on the second surface of the semiconductor substrate. The source connection terminal is electrically connected with the source region and the drain connection terminal is electrically connected with the drain region.

In another embodiment, an integrated circuit device includes a semiconductor substrate having a first surface and a second surface opposite the first surface. The integrated circuit device also includes at least one transistor device comprising a gate structure disposed on the first surface and configured to form a channel region. The at least one transistor device also includes a source region and a drain region region disposed on opposite sides of the channel region, and a source connection terminal and a drain connection terminal disposed on the second surface of the semiconductor substrate. The source connection terminal is electrically connected with the source region and the drain connection terminal is electrically connected with the drain region.

In yet another embodiment, a method for manufacturing an integrated device includes providing a semiconductor substrate having a first surface and a second surface opposite the first surface, forming a shallow trench isolation in the semiconductor substrate having a first depth, forming a gate insulating layer on the first surface of the first semiconductor substrate, a gate electrode on the gate insulating layer and gate sidewalls on side surfaces of the gate electrode, forming a source region and a drain region in the semiconductor substrate, and forming a source connection terminal on the second surface configured to connect with the source region and a drain connection terminal on the second surface configured to connect with the drain region.

In an embodiment, the method further includes forming a gate terminal on the gate electrode. In another embodiment, the method also includes bonding a bearer substrate to the first surface of the semiconductor substrate and submitting the second surface of the semiconductor to a thinning treatment process to remove a second depth. The second depth is greater than or equal to the first depth.

Before undertaking the detailed description below, it may be advantageous to set forth definitions of certain terms used throughout the present invention. It will be understood that when an element or layer is referred to as being "on," "adjacent to," "connected to" or "coupled to" another element or layer, it can be directly on the other element or layer, it can be directly adjacent to, connected or coupled to the other element or layer, or intervening elements or layers may be present. In contrast, when an element is referred to as being "directly on," "directly adjacent to," "directly connected to" or "directly coupled to" another element or layer, there are no intervening elements or layers present. It will be understood that, although the terms first, second, third, etc., describe various elements, components, areas (regions), layers and/or sections, these elements, components, areas, layers and/or sections should not be limited by these terms. These terms are only used to distinguish one element, component, area (region), layer or section from another element, component, region, layer or section. Therefore, the following discussion of a first element, component, area (region), layer or section may be expressed as a second element, component, area, region, layer or section without departing from the teachings of the present invention below.

Spatial relative terms, such as "lower," "under," "below," "underneath," and "on," "above," and the like may be used herein for ease of description to describe one element or feature relationship to another element(s) or feature(s) as shown in the figures. It will be understood that, in addition to the orientation shown in the figures, the spatially relative terms are intended to include different orientations of the device in use or operation. For example, if the device in the figures is turned over, elements described as "below," "beneath," or "under" other elements would then be oriented "above" other elements or features. Thus, the exemplary term "below" and "under" may include both above and below orientations. The device may additionally be oriented (rotated 90 degrees or other orientations) and the spatial relative description terms used herein are interpreted accordingly.

Terminology used herein is only for the purpose of describing particular exemplary embodiments and is not intended to be limiting the present invention. As used herein, the singular forms "a," "an," and "said/the" are intended to include the plural forms as well, unless the context clearly indicates otherwise. It will also be understood that the term "including" and/or "comprising," when used in this specification, specifies the stated features, integers, steps, operations, elements, and/or components, but do not exclude other features, integers, steps, operations, elements, components, and/or groups thereof. As used herein, the term "and/or" may include any of the associated listed items and combinations thereof.

BRIEF DESCRIPTION OF THE DRAWINGS

Various embodiments of the present invention will be more clearly understood from the following detailed description taken in conjunction from the accompanying drawings, in which.

DETAILED DESCRIPTION OF THE INVENTION

Figure 1A:
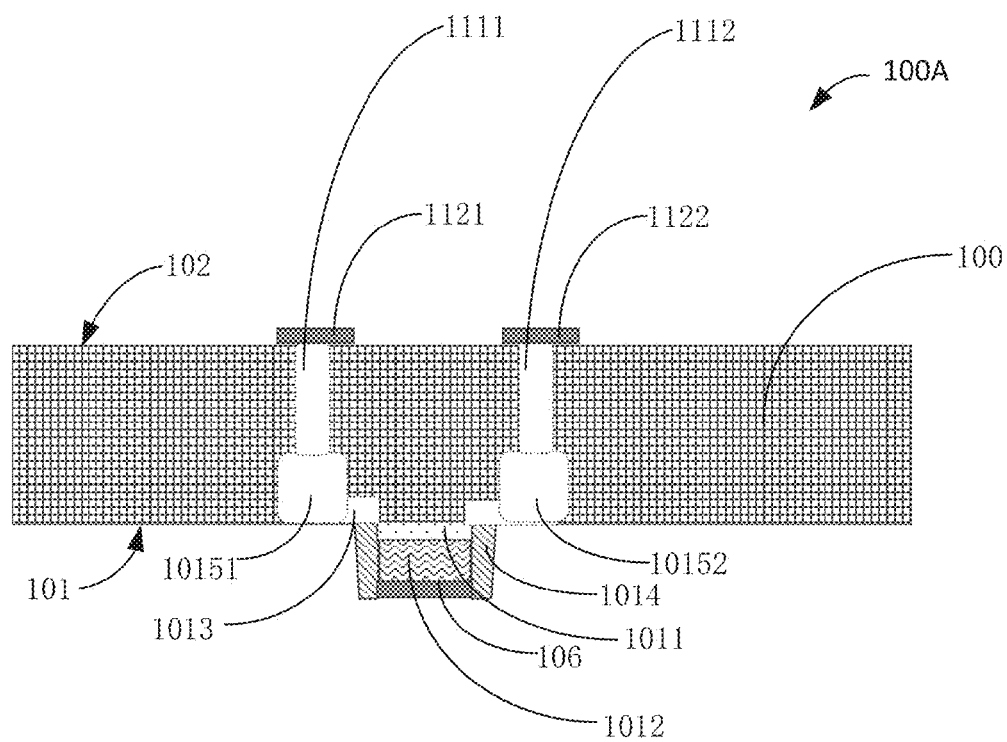
FIG. 1A is a cross-sectional view of an exemplary structure of a transistor device according to the first embodiment of the present invention.

Embodiments of the present invention will now be described more fully with reference to the accompanying drawings. The same elements in the drawings are denoted by the same reference numerals and a repeated description thereof will not be given for the sake of brevity.

It will be understood that the present invention can be implemented in different forms and should not be construed as limited to the exemplary embodiments set forth herein. Rather, these embodiments are provided so that the disclosure will be thorough and complete, and the scope of the present invention is completely conveyed to one of the ordinary skill in the art, in the drawings, the dimensions and the relative size of layers and regions may not be drawn to scale for clarity reason.

Embodiments of the present invention should not be limited to the particular shapes of regions illustrated herein, but may include deviations in shapes that result, for example, from manufacturing process variations. For example, an implanted region shown as a rectangle at its periphery may have rounded or curved features and/or a doping concentration gradient, rather than from an abrupt change from an implanted region to a non-implanted region. Similarly, a buried region formed by implantation may result in an injected area having a surface through which the implantation is carried out in the buried region. Thus, the areas shown in the figures are schematic in nature and their shapes are not intended to display the actual shape of the areas and to limit the scope of the present invention.

Preferred embodiments of the present invention are described below in detail. However, it will be understood that other alternative embodiments of the present invention are possible.

First Embodiment

An embodiment of the present invention provides a field effect transistor device (FET, interchangeably referred to as "transistor," "transistor device," or "device") that includes a semiconductor substrate. The semiconductor substrate includes a first surface having a gate structure formed thereon. The gate structure is configured to form a channel region in the semiconductor substrate. The semiconductor substrate includes a source region and a drain region formed on opposite sides of the channel region. The semiconductor substrate also includes a second surface having a source connection terminal and a drain terminal formed thereon. The source connection terminal is configured to connect the source region and the drain connection terminal is configured to connect the drain region. The first surface and the second surface are disposed on opposite sides of the semiconductor substrate.

Figure 1B:
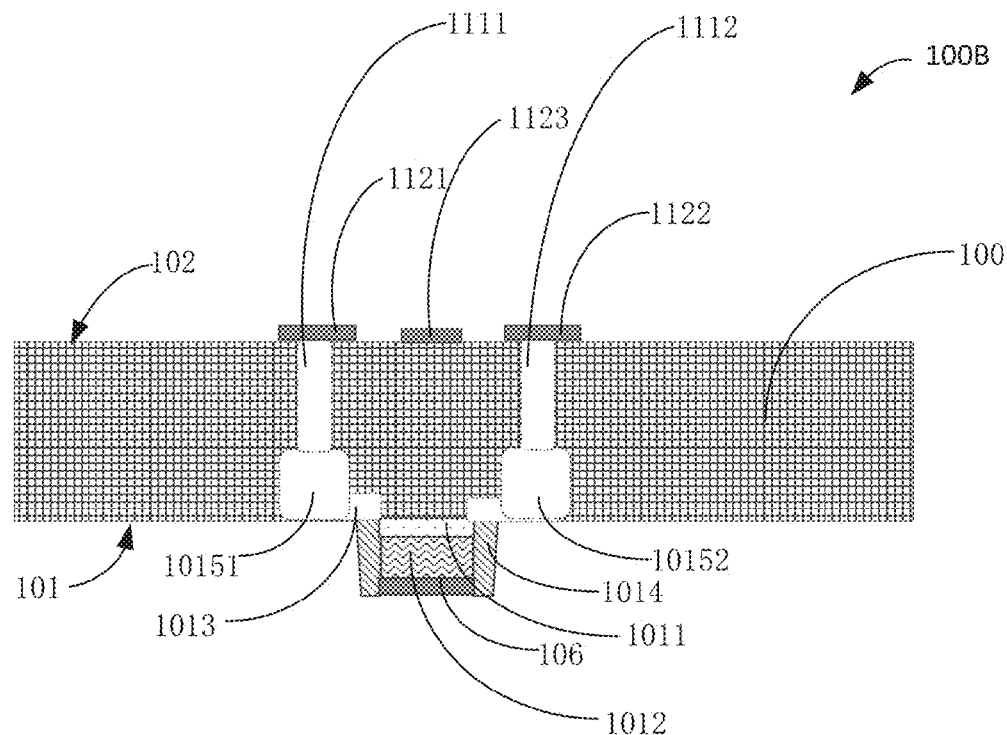
FIG. 1B a cross-sectional view of another exemplary structure of a transistor device according to the first embodiment of the present invention.

FIGS. 1A and 1B are cross sectional views of exemplary structures of a transistor according to the first embodiment of the present invention. As shown in FIG. 1A, transistor device 100A includes a semiconductor substrate 100 ("substrate") having a first surface 101 and a second surface 102 opposite the first surface, a gate structure including a gate insulating layer 1011 formed on a portion of the first surface 101 of the substrate, a gate layer 1012 formed on gate insulating layer 1011, a source region within the substrate having a first source portion 10151 and a second source portion 1111, and a drain region having a first drain portion 10152 and a second drain portion 1112. Second surface 102 of the substrate includes a source connection terminal 1121 that is configured to connect the first source portion 10151 through source second portion 1111. Second surface 102 also includes a drain connection terminal 1122 that is configured to connect the first drain portion 10152 through the second drain portion 1112.

In the example shown in FIG. 1A, the source region includes first source portion 10151 and second source portion 1111 the drain region includes first drain portion 10152 and second portion 1112. In other embodiments, the source region and the drain region can be implemented as an integral structure and be formed through the first surface to the second surface of substrate 100 in a deep implantation process.

In an embodiment, transistor device 100A may include a gate terminal 106 overlying gate layer 1012. In an embodiment, source connection terminal 1121, drain terminal 1122, and gate terminal 106 may comprise a metal silicide. In another embodiment, source connection terminal 1121, drain terminal 1122, and gate terminal 106 may comprise copper, aluminum, other metal materials, or ions doped regions.

Because source connection terminal 1121 and drain connection terminal 1122 are disposed on one side of the substrate, and gate terminal 1012 is disposed on an opposite side of the substrate, the coupling capacitance between source, drain terminals and the gate terminal will be reduced, and the transistor device performance will be improved.

Transistor device 100A may further include gate sidewalls 1014 disposed on opposite sides of the gate structure, and lightly doped regions 1013 disposed underneath the sidewalls.

FIG. 1B provides a cross-sectional view of transistor device 100B according to the first embodiment of the present invention. Transistor device 100B comprises similar provisions as defined in cross-sectional view of transistor device 100A in FIG. 1A except with a difference on the surface where source/drain connector terminals are formed onto. Transistor device 100B further comprises a body electrode (body terminal) 1123, which is disposed on the same surface of the substrate, on which the source and drain connection terminals 1121, 1122 are disposed. In an exemplary embodiment, body terminal 1123 is disposed between source and drain connection terminals 1121, 1122. In an embodiment, body terminal 1123 may be a metal, metal silicide, or other suitable materials. Body-terminal 1123 forms a fourth terminal of transistor device 10013 and is connected to the semiconductor substrate. When transistor device 100B is used in integrated circuits, the body terminal 1123 may be used to provide conductivity modulation operation. In integrated circuits, the body-terminal of the transistor device is usually connected with the highest or lowest supply voltage.

In the embodiment, source connection terminal 1121 and drain connection terminal 1122 and the gate terminal 1122 are disposed on a surface that is opposite to the surface of the substrate where gate layer 1012 is disposed on. Consequently, coupling capacitance between the gate and the source and drain of the transistor device will be reduced, and the performance of the transistor device will be improved.

The present invention further provides a method for manufacturing a transistor device of the first embodiment described above. Referring to FIGS. 1A and 1B, the method may include:

At step E101, providing a semiconductor substrate 100 having a gate structure comprising a gate insulating layer 1011 disposed on a first surface 101, a gate layer 1012 on the gate insulating layer, and gate side walls 1014 disposed on sidewalls of the gate structure. In an embodiment, step E101 may include forming lightly doped regions 1013 disposed adjacent to source and drain regions. In another embodiment, step E101 may further include forming a gate connection terminal 106 on gate layer 1012. In an embodiment, source connection terminal 1121, drain connection terminal 1122, and of the connection terminal 106 may be a metal silicide material or other suitable metal materials.

At step E102, forming a source region and a drain region in semiconductor substrate 100. In an embodiment, the source region includes a first source portion 10151 and a second source portion 1111. The drain region includes a first drain portion 10152 and a second drain portion 1112. In an embodiment, step E102 may include performing a first ion implantation on the first surface 101 of the semiconductor substrate 100 to form the first portion 10151 of the source region and the drain portion 10152 of the drain region (process E1021), and performing a second ion implantation on the second surface 102 of the semiconductor substrate 100 to form the second source portion 1111 and the second drain portion 1112 (process E1022). In an alternative embodiment, the source region and the drain region may be a structure that is formed through a deep implantation on the first surface 101 that penetrates deep into the substrate to reach the second surface 102 of the first semiconductor substrate.

At step E103 forming source connection terminal 121 and drain connection terminal 1122 on the second surface 102 of semiconductor substrate 100. In an embodiment, step E103 may include concurrently forming a body terminal together with forming the source connection terminal 1121 and the drain connection terminal 1122, as shown in FIG. 1B.

The transistor device manufactured by the method described above advantageously provides reduced coupling capacitance between the gate and the source/drain and improved transistor device performance.

Second Embodiment

Figure 2:
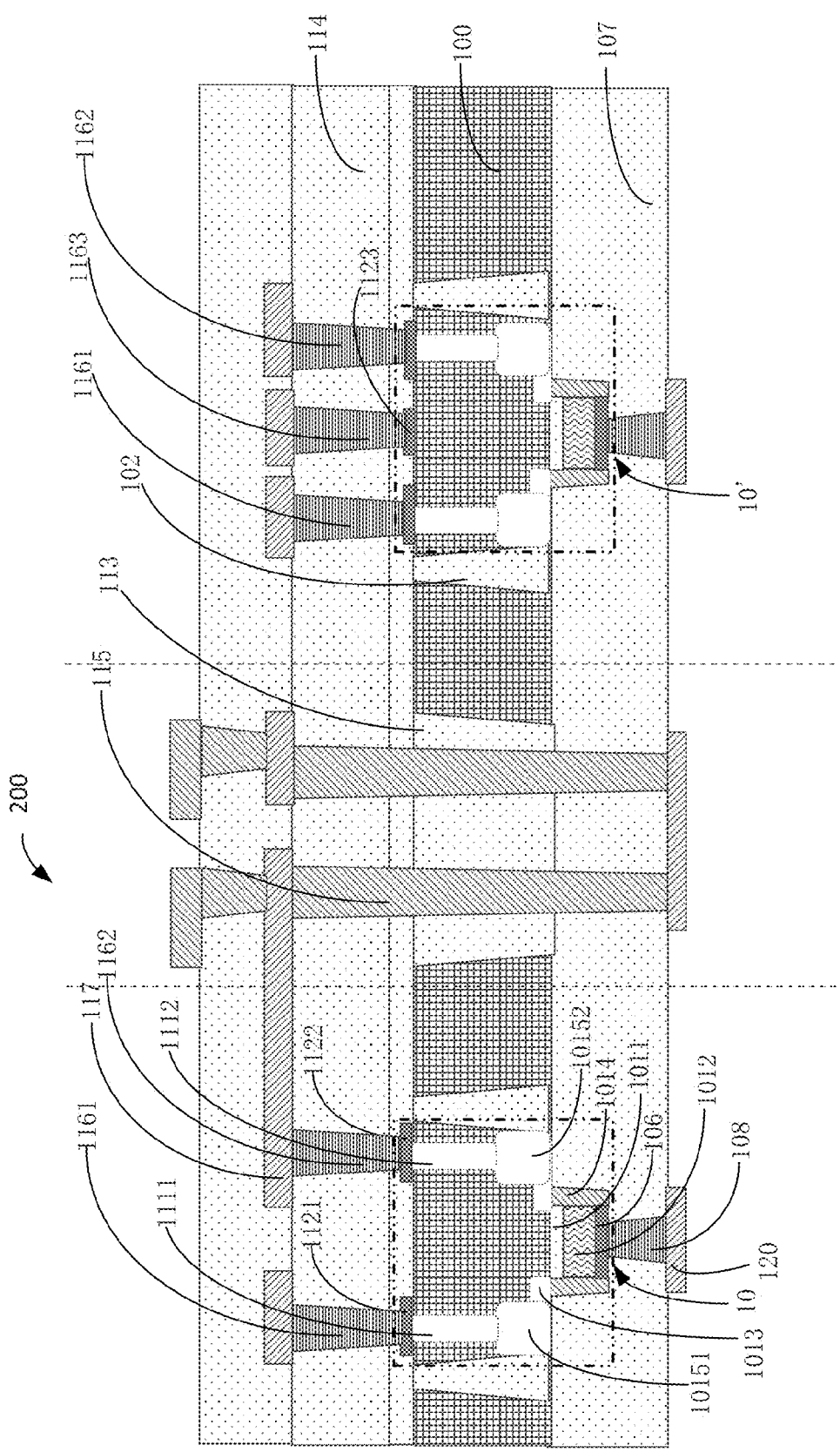
FIG. 2 is a cross-sectional view of an exemplary structure of an integrated circuit device according to the second embodiment of the present invention.

FIG. 2 is a cross-sectional view of an exemplary structure of an integrated circuit (IC) device 200 according to the second embodiment of the present invention. IC device 200 includes a semiconductor substrate 100 and a transistor device 10 provided thereon. First transistor 10 may include, in part, a gate insulating layer 1011 disposed on a first surface of the substrate, a gate layer 1012 disposed on the gate insulating layer and configured to form a channel region in the substrate, a source region including a first source portion 10151 and a second source portion 1111, and a drain region including a first drain portion 10152 and a second drain portion 1112. The source and drain regions are disposed on opposite sides of the channel region. The semiconductor substrate further includes a second surface having a source connection terminal (or source terminal) 1121 and a drain connection terminal (or drain terminal) 1122 disposed thereon. The first and second surfaces are on opposite side of the substrate 100. The source terminal is configured to electrically connect the source region and the drain terminal is configured to electrically connect the drain region. IC device 200 may include a multitude of transistor devices. FIG. 2 shows only transistor devices 10 and 10' for reason of clarity.

In the example shown in FIG. 2, the source region includes a first source portion 10151 and a second source portion 1111, the drain region includes a first drain portion 10152 and a drain second portion 1112. In an embodiment, the first source portion 10151 may be formed by performing an ion implantation on the first surface of the semiconductor substrate 100, and the second source portion 1111 may be formed by performing an ion implantation on the second surface of the semiconductor substrate 100. Similarly, the first drain portion 10152 may be formed by performing an ion implantation on the first surface of the semiconductor substrate 100, and the second drain portion 1112 may be formed by performing an ion implantation on the second surface of the semiconductor substrate 100. In another embodiment, the source region and the drain region can be an integral structure that is formed by performing a deep implantation on the first surface that penetrates deep into the substrate and reaches the second surface of the semiconductor substrate 100.

In an embodiment, the process is continued by forming a gate terminal 106 on the gate layer 1012 that is configured to electrically connect the gate layer.

In an embodiment, the process further includes forming a source connection terminal 1121, a drain connection terminal 1122 on the second surface of the substrate. The source connection terminal 1121, the drain connection terminal 1122 and the gate terminal 106 can be a metal silicide. In another embodiment, the source connection terminal 1121, the drain connection terminal 1122 and the gate terminal 106 may be copper, aluminum and other metal materials, or doped with ions (i.e., ion-doped regions as the source connection terminal 1121, the drain connection terminal 1122, or the gate connection terminal 106).

In an embodiment, the transistor 10 may also include an electrode body (body terminal) 1123 that is disposed on the second surface of semiconductor substrate 100, as shown in transistor 10' on the right side of FIG. 2. Transistor 10 scan be regarded as a special case of transistor 10. Body terminal 1123 may be a metal, metal silicides, or other suitable materials. Body terminal 1123 is the fourth terminal of transistor 10' that is connected, to the semiconductor substrate. When transistor 10' is used in an integrated circuit, the body terminal 1123 may be used for modulation during operation of the transistor. In an embodiment, the body terminal 1123 of transistor 10 is connected to the highest or lowest supply voltage of the integrated circuit. It will be appreciated that, although transistor 10 and the transistor 10' are shown in FIG. 2, an integrated circuit according to an embodiment of the present invention does not require both transistors transistor 10 and the transistor 10') to be present. In an embodiment, the integrated, circuit may include only one of these transistor types (i.e., either transistor 10 or transistor 10'). In another embodiment, the integrated circuit may include both transistor types (transistor 10 and the transistor 10').

In the embodiment, transistor 10 may further include a gate insulating layer 1011, gate side-walls 1014, and lightly doped regions 1013. Gate insulating layer 1011, gate sidewalls 1014, and lightly doped regions 1013 can be formed of structures and materials according to the conventional art and will not be described herein for sake of brevity.

IC device 200 may include an interlayer dielectric layer 107 disposed on the first surface of semiconductor substrate 100, an interlayer dielectric layer 114 disposed on the second surface of the semiconductor substrate, contact holes 108 disposed in interlayer dielectric layer 107 and configured to connect with gate terminal 116, contact holes 1161, 1162, 1163 disposed in interlayer dielectric layer 114 and configured to connect with respective source, drain, and body connection terminals 1121, 1122, and 1163. IC device 200 may include a dielectric layer 113 that is disposed between transistors 10 and 10'. IC device 200 may also include metal layers 120, 117 that are disposed on the first and second surfaces of semiconductor substrate 100.

IC device 200 further includes a through-silicon-via (TSV) 115 extending through dielectric layer 113 of semiconductor substrate 100. Through silicon via 115 may be disposed in a region outside transistor 10 (transistor 10'). In the embodiment, silicon through silicon via 115 is configured to electrically connect the first and second surfaces of semiconductor substrate 100. Through-silicon via 115 may be disposed through the metal layer 117, the contact holes 1162, drain terminal 1122 on the second surface to connect the first and second surfaces of the semiconductor substrate 100, as shown in FIG. 2. Through silicon via 115 can also connect through the source terminal 1121, a contact hole 1161 and the metal layer 117 with the source region (1111, 10151). Through silicon via 115 can comprise one or more metal layers, and other structures and is not limited to structures shown in FIG. 2. IC device 200 may include a number of through silicon vias 115. Those of skill in the art will recognize that silicon through holes and through silicon vias are used to connect elements disposed on opposite surfaces of the semiconductor substrates. The terms silicon through holes and through silicon vias may thus be used interchangeably herein. The use of silicon through holes 115 for connecting the first and second surfaces not only reduce packaging process complexity, but also reduce coupling capacitance value of the gate and source/drain terminals and improve the IC device performance.

Third Embodiment

Figure 3A:
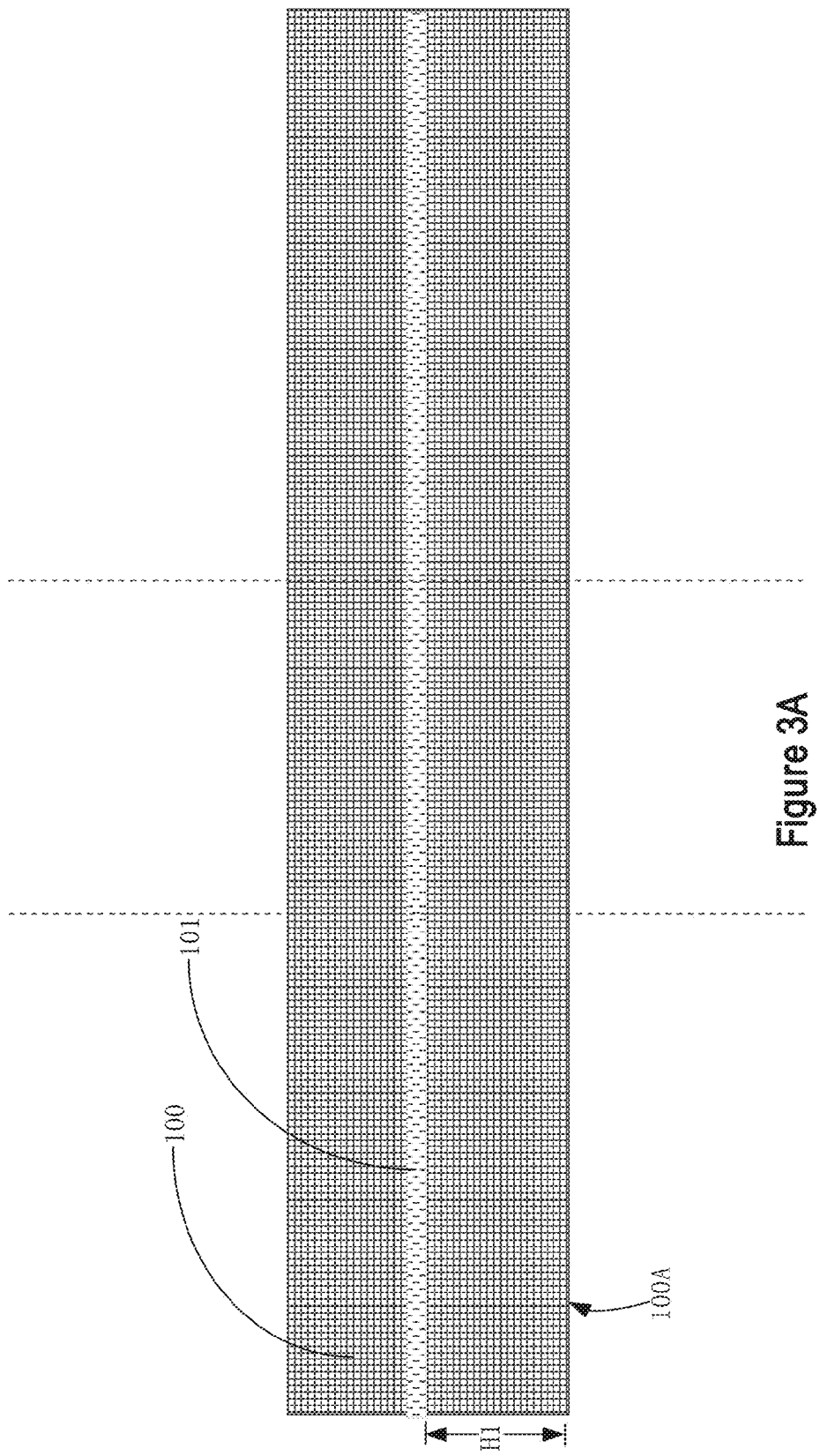
FIGS. 3A through 3J are cross-sectional views illustrating in sequence the process steps in manufacturing an integrated circuit according to the third embodiment of the present invention.
Figure 3B:
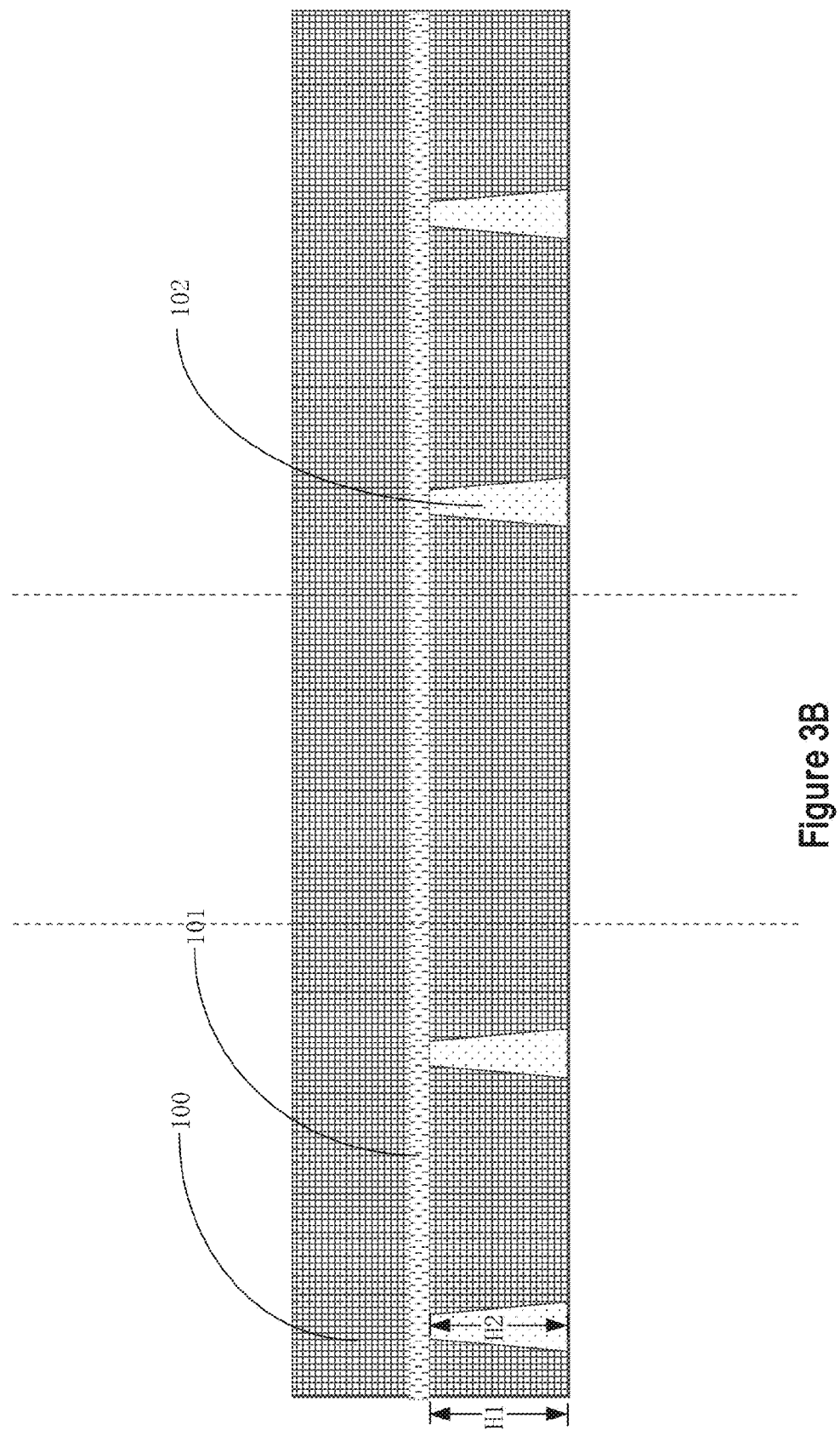
Figure 3C:
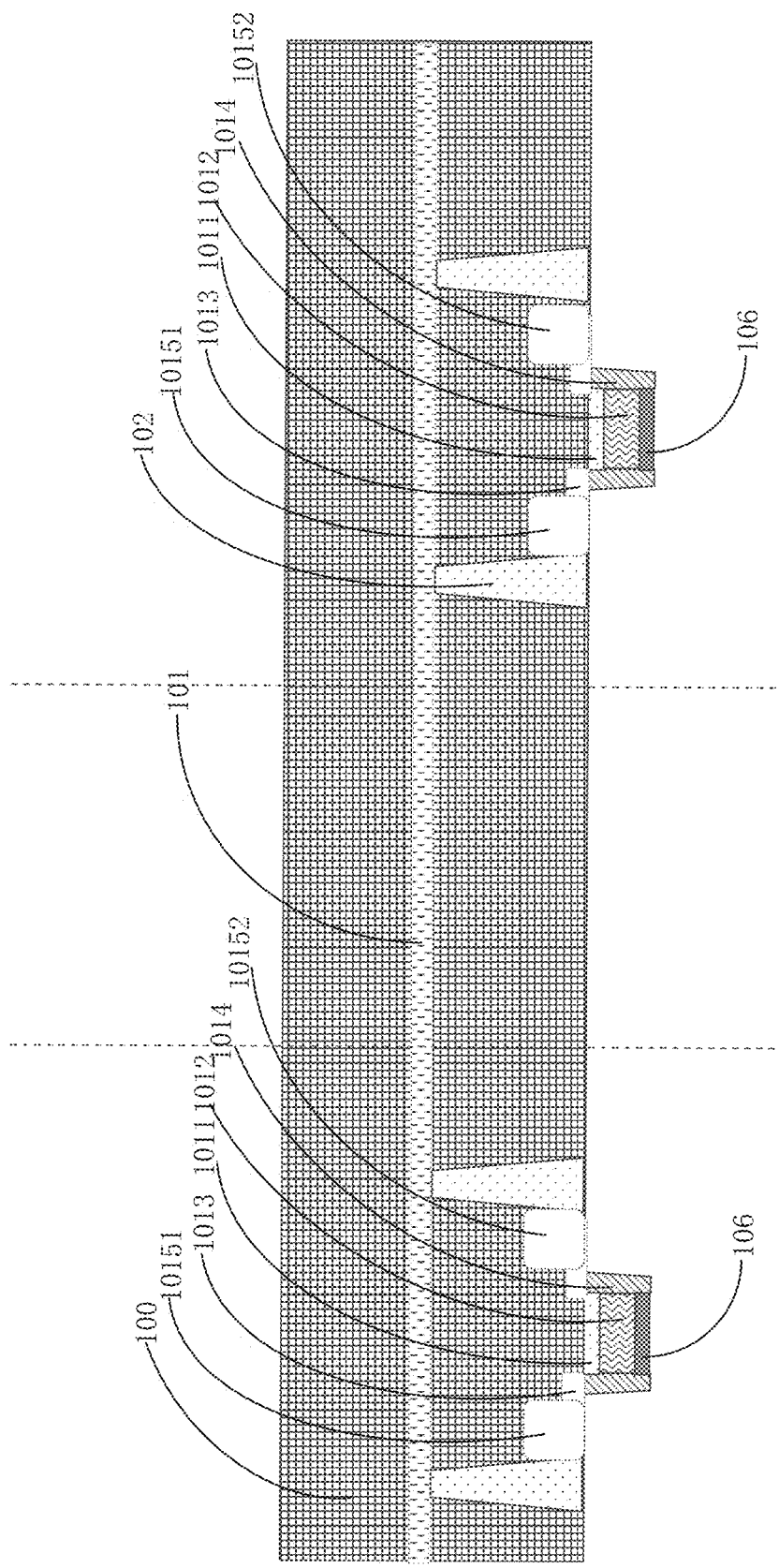
Figure 3D:
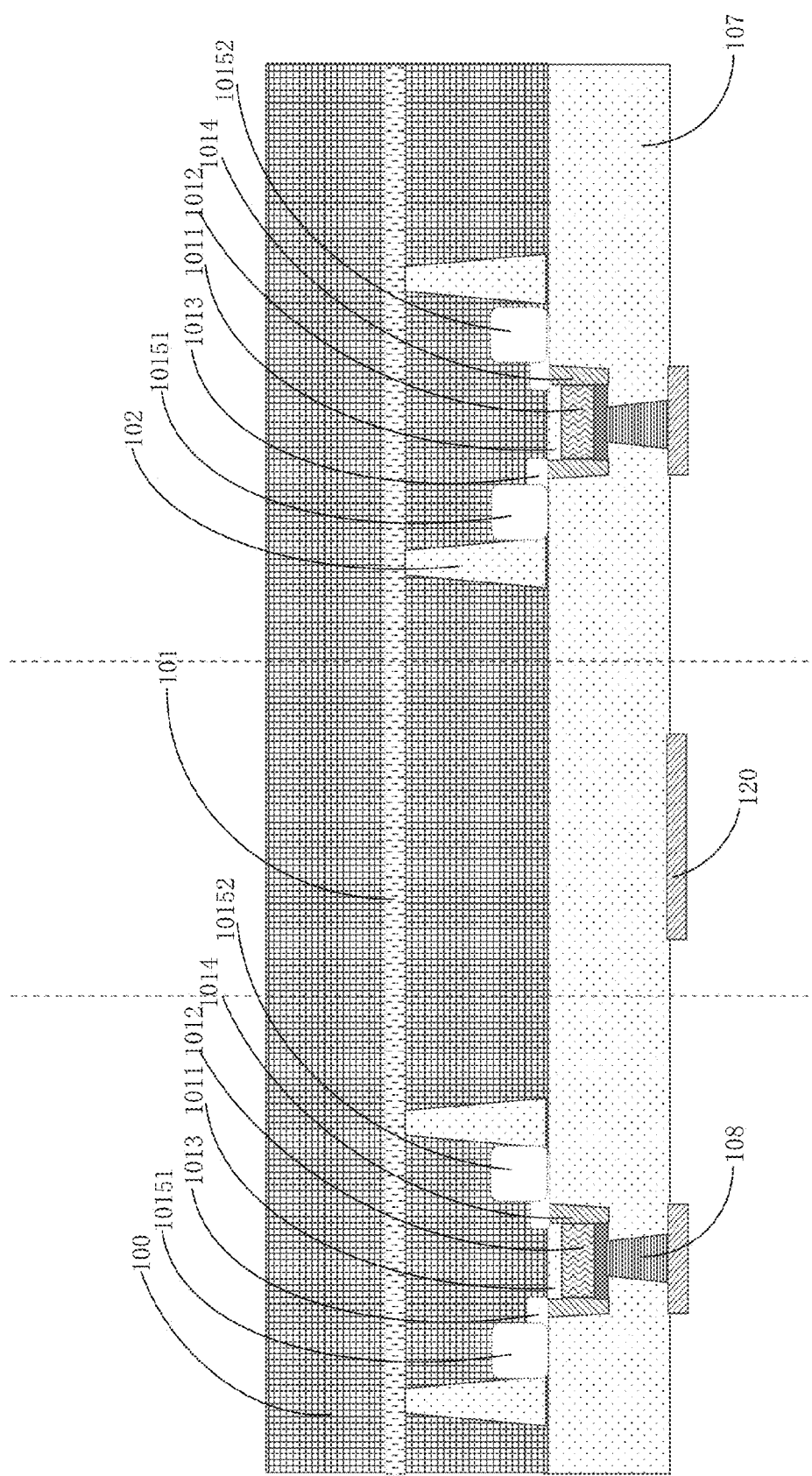
Figure 3E:
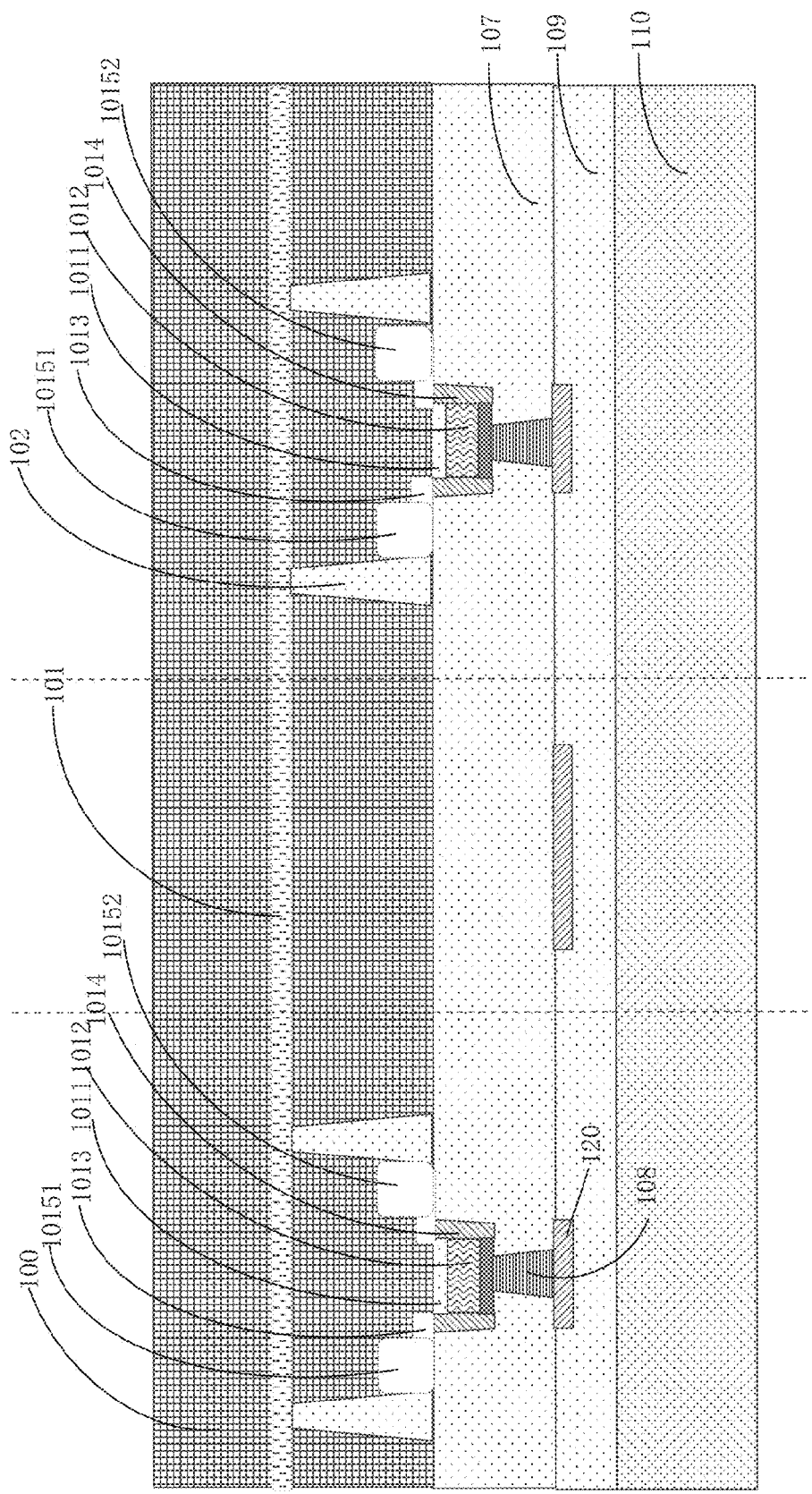
Figure 3F:
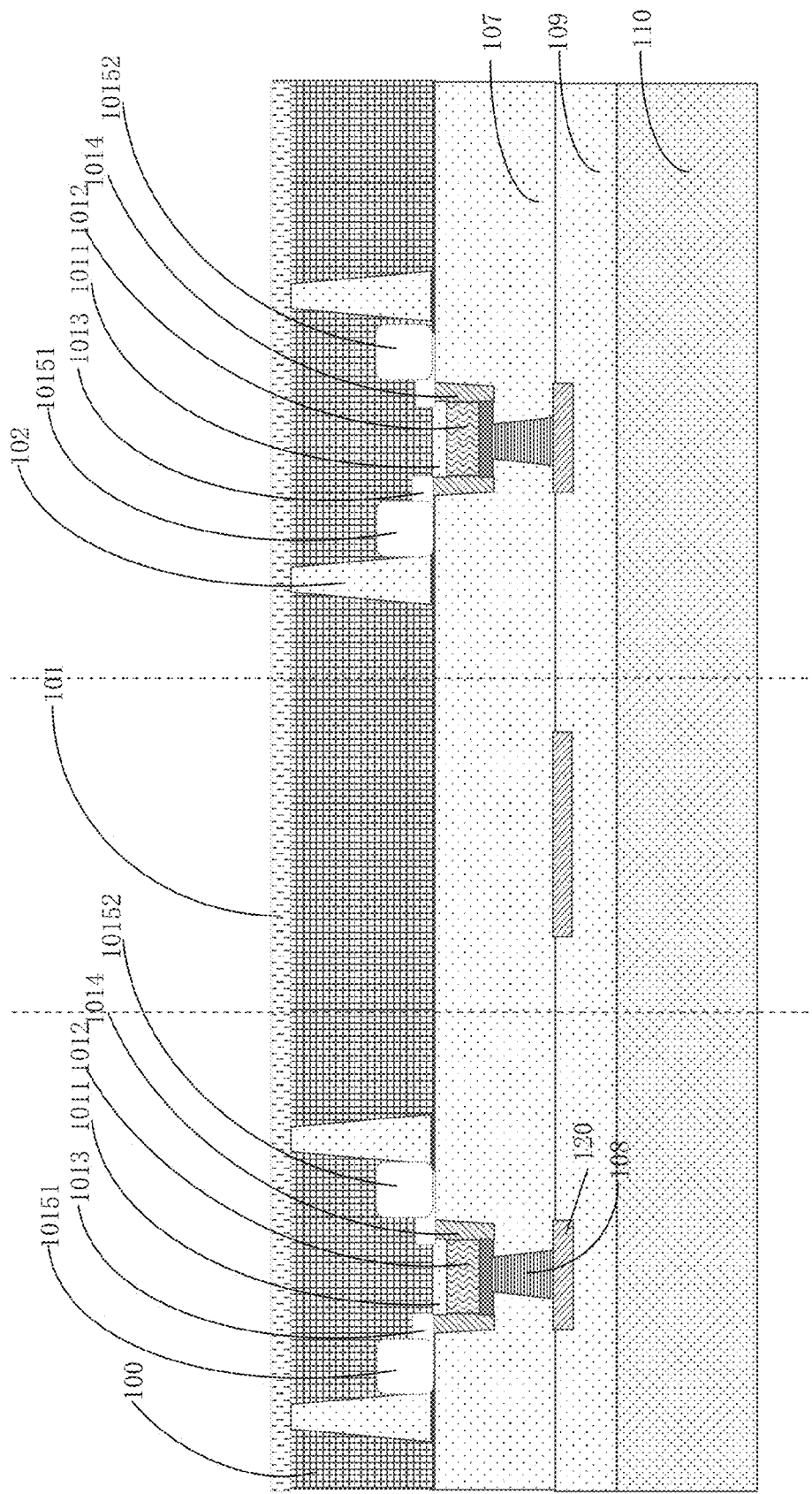
Figure 3G:
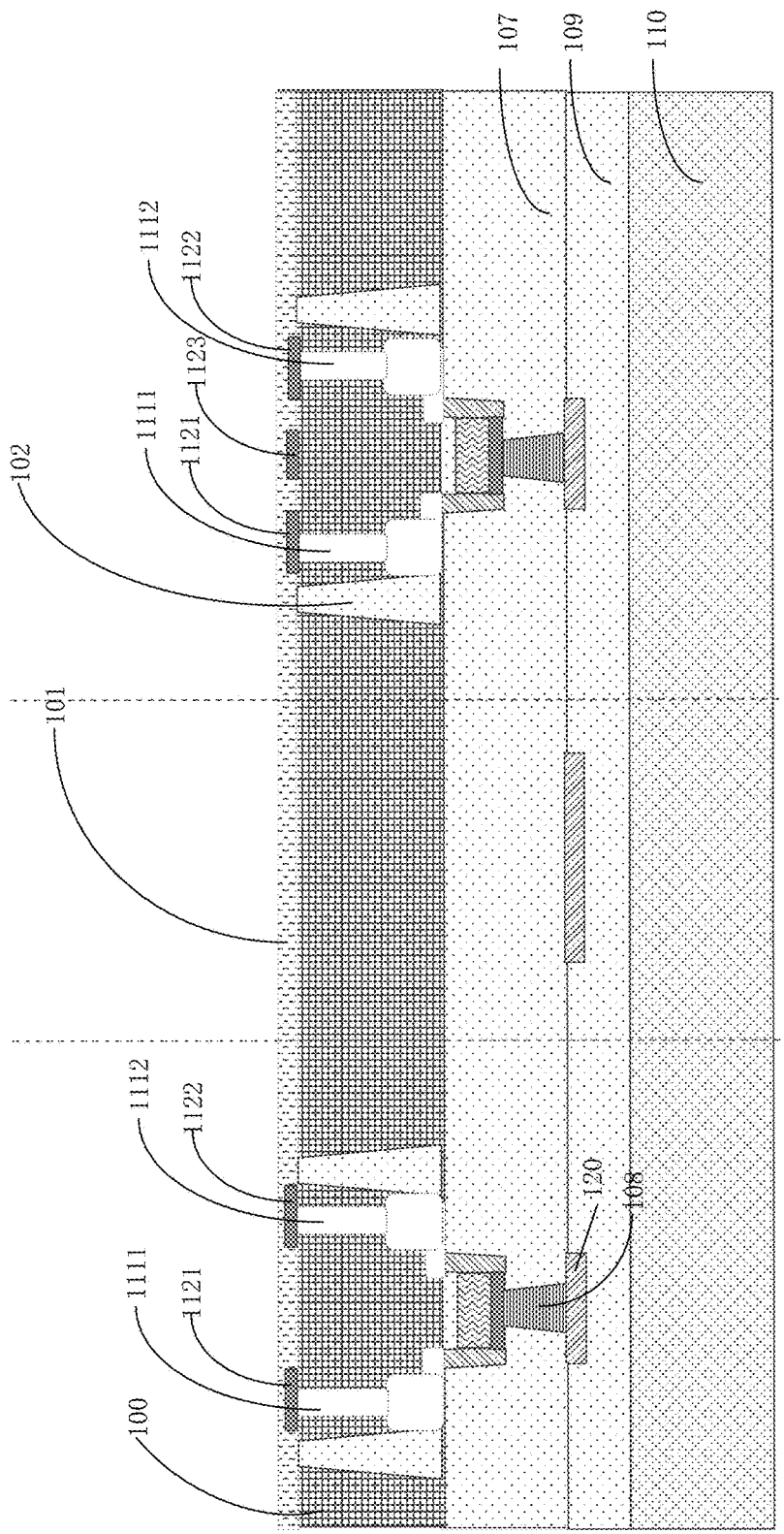
Figure 3H:
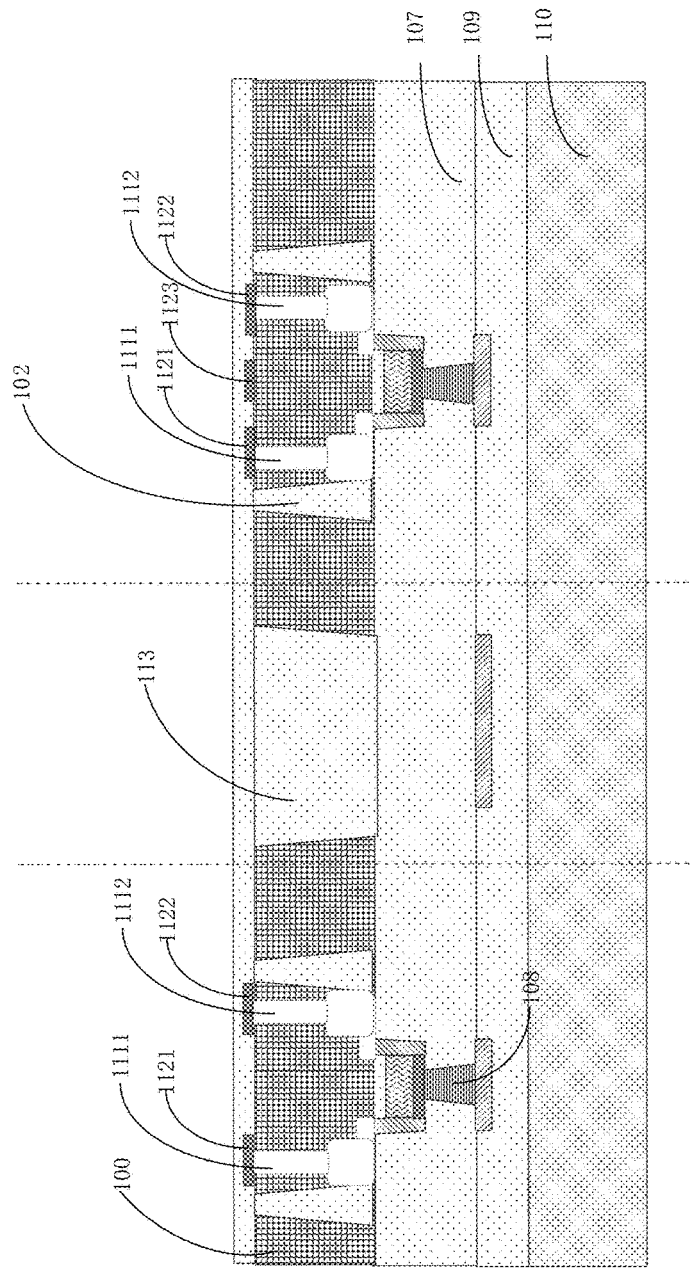
Figure 3I:
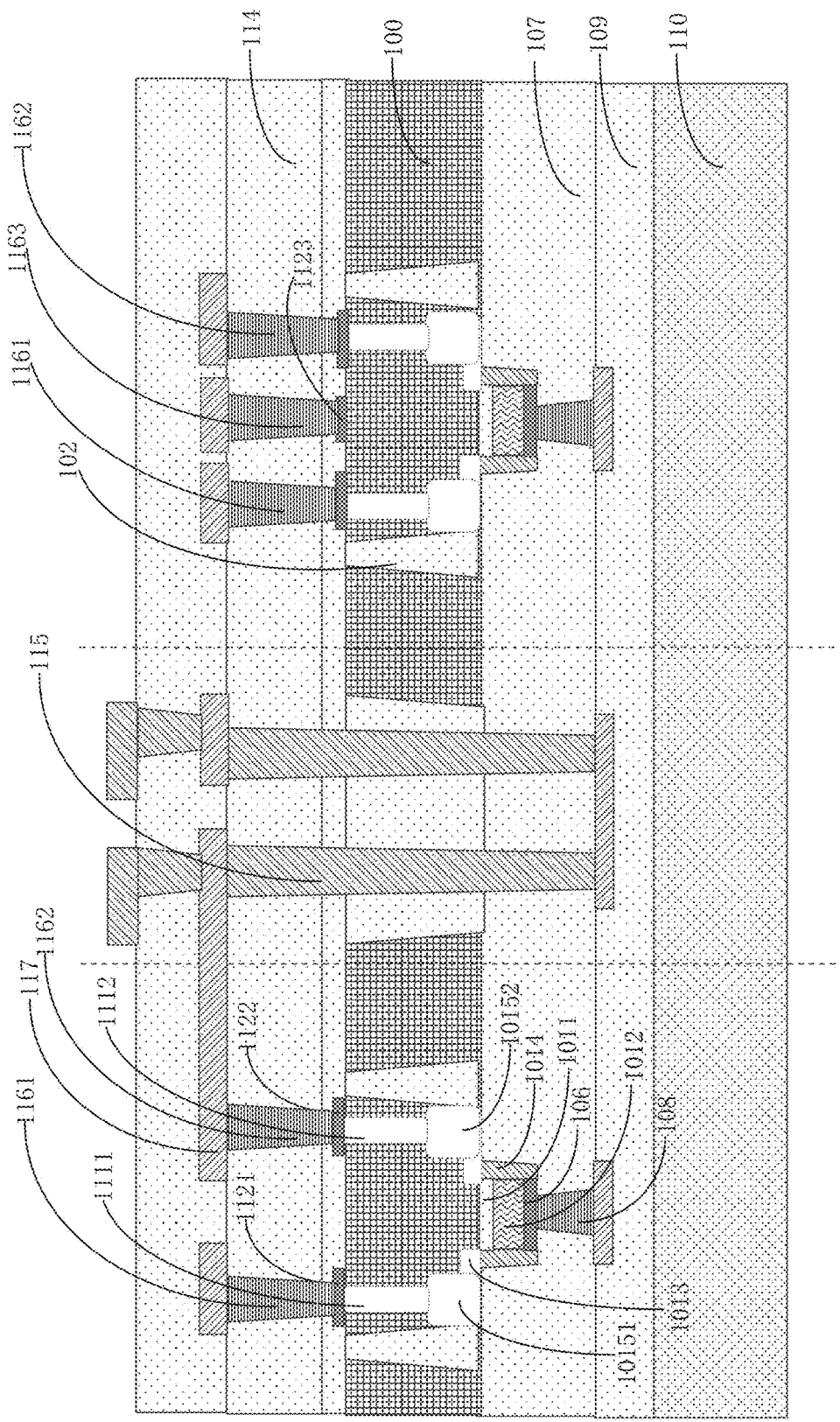
Figure 3J:
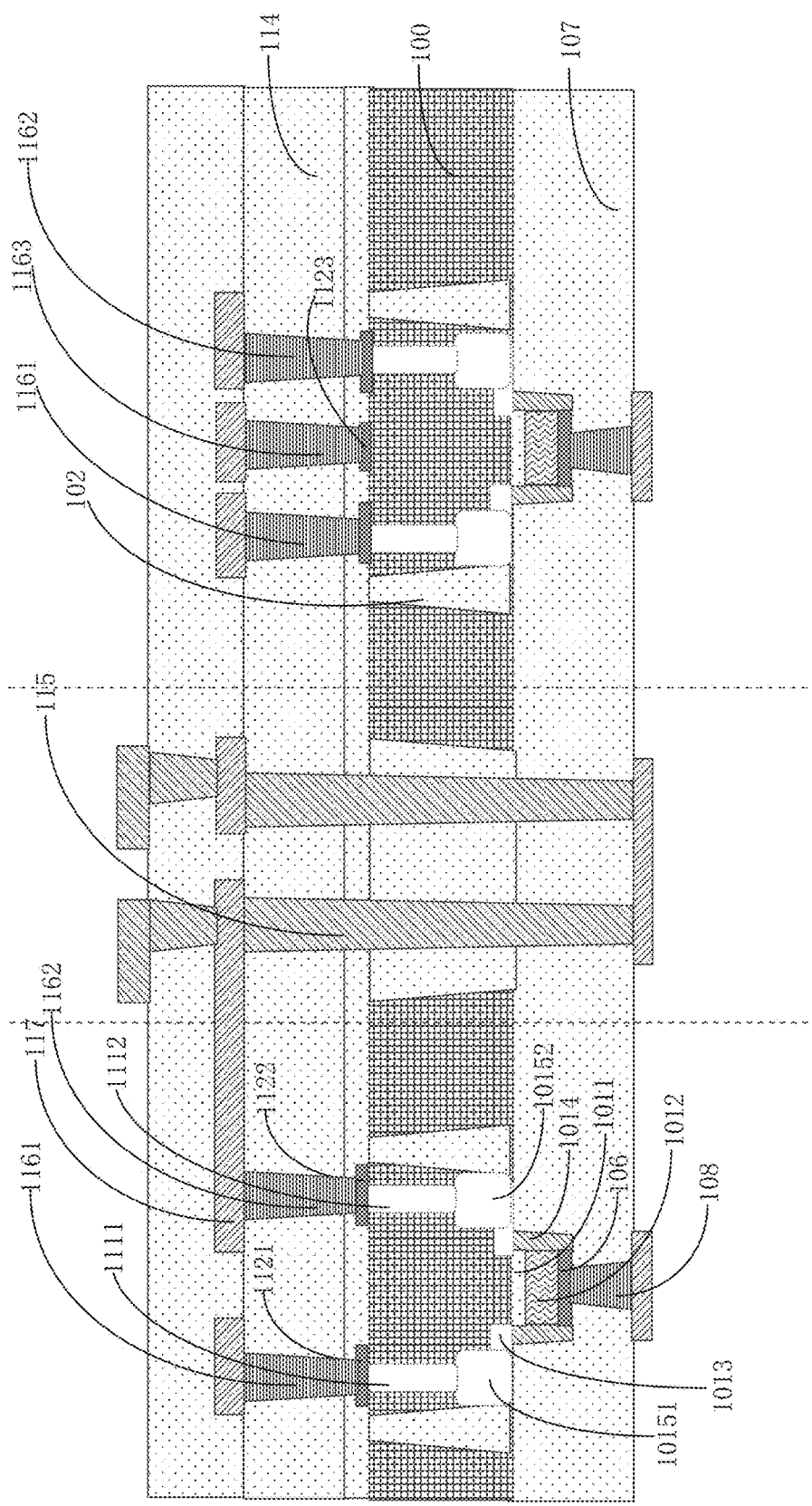
Figure 4:
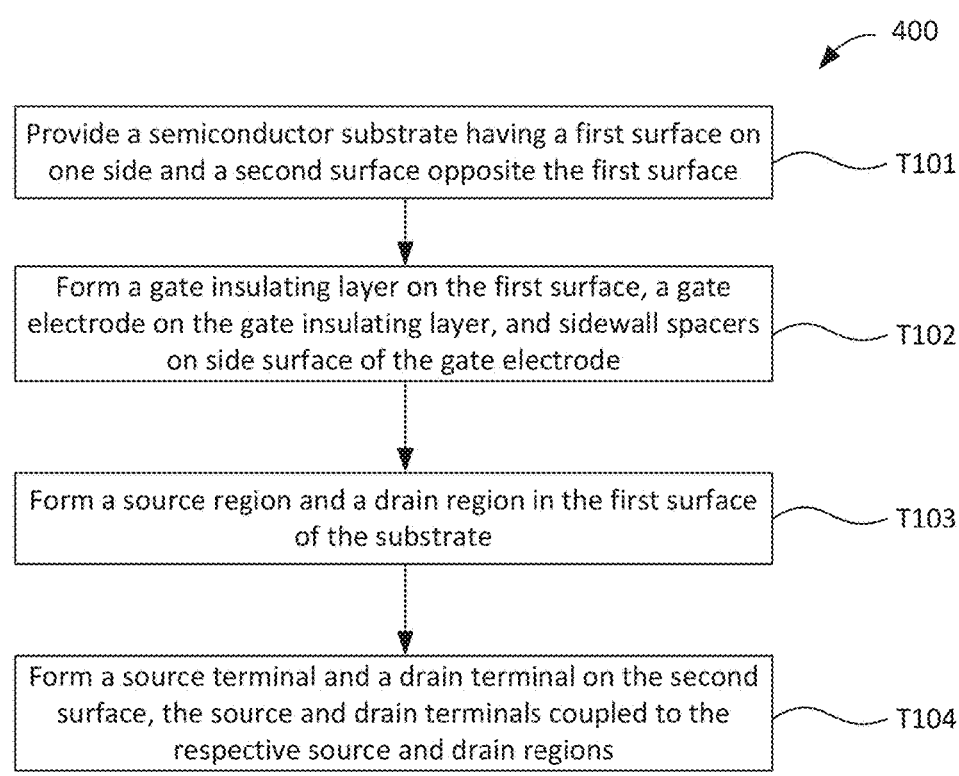
FIG. 4 is a flowchart diagram of a method for manufacturing an integrated circuit according to the third embodiment of the present invention.
Figure 5:
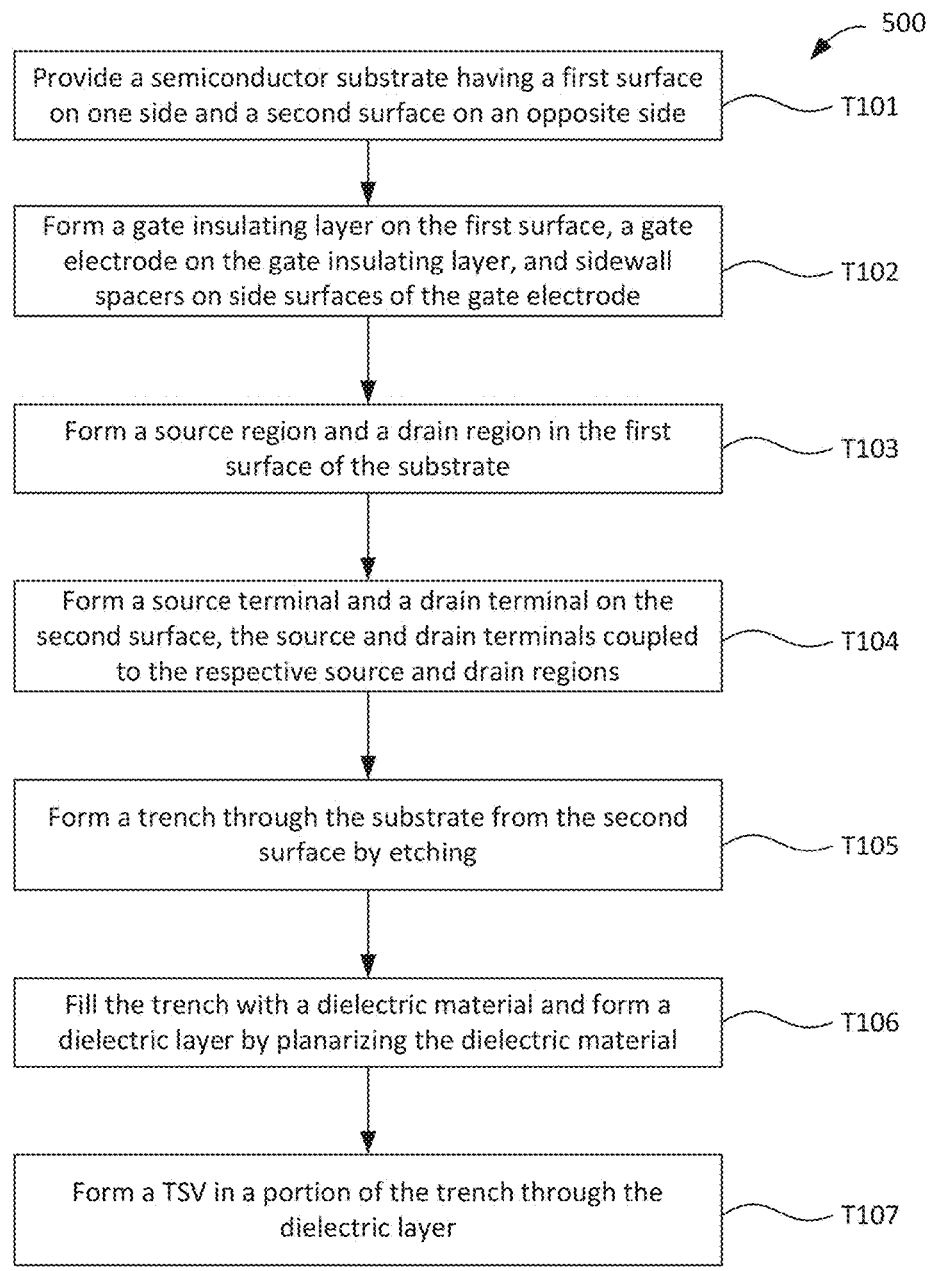
FIG. 5 is a flowchart diagram of another method for manufacturing an integrated circuit according to the third embodiment of the present invention.

Referring, to FIGS. 3A-3J, FIG. 4, and FIG. 5, a method for manufacturing an integrated circuit according to embodiment of the present invention will be described in detail. FIGS. 3A to 3J are schematic cross-sectional views illustrating in sequence the process steps in manufacturing an integrated circuit according to the third embodiment of the present invention; FIG. 4 is a flowchart diagram illustrating a method 400 for manufacturing a transistor device according to an embodiment of the present invention; FIG. 5 is a flowchart diagram illustrating a method 500 for manufacturing a transistor device according to another embodiment of the present invention.

In accordance with the third embodiment of the present invention, a method for manufacturing a semiconductor device includes the following steps:

At step A1 providing a semiconductor substrate 100, and thrilling a thin stop layer (also referred to as "etch stop layer" or "stop layer" herein) 101 within semiconductor substrate 100. Stop layer 101 is formed parallel to a planar surface (first surface) 100A of the semiconductor substrate 100 and has a first depth H1. The term "depth" is referred to as the distance of the stop layer with respect to the planar surface of the semiconductor substrate 100, as shown in FIG. 3A.

In the embodiment, the first surface 100A of the semiconductor substrate 100 is the side of the substrate that includes a gate structure formed thereon. The second surface is the side of the semiconductor substrate opposite the first surface.

In an embodiment, semiconductor substrate 100 comprises bulk silicon (bulk Si). Stop layer 101 may comprise oxide (silicon oxide) or other suitable materials. The stop layer 101 may be formed by injecting oxygen into the semiconductor substrate to a first depth H1 to obtain an oxygen ion layer (process A101) and heating the oxygen ion layer to form the stop layer (process A102). Additionally, forming the thinning stop layer 101 may include using an epitaxial growth method as known in the art, so a detailed description will be omitted herein.

In an embodiment, stop layer 101 is used to reduce undesirable over-etching of the semiconductor 100. Stop layer 101 can be omitted according to an embodiment of the present invention.

At step A2, forming a shallow trench isolation (STI) 102 in semiconductor substrate. 100, shallow trench isolation 102 may have a second depth H2, as shown in FIG. 3B. In an embodiment, second depth H2 is less than or equal to the first depth H1. In an embodiment, the semiconductor device may have a number of the shallow trench isolation regions that can have same or different depths H2.

At step A3, performing an ion implantation onto the first surface of the first semiconductor substrate 100 to form a well region (not shown) and a channel region (not shown).

At step A4, forming a gate insulating layer 1011 and a gate layer 1012 on the first surface of semiconductor substrate 100, and forming lightly doped regions 1013 in the semiconductor substrate, and gate sidewalls 1014 on side surfaces of the gate insulating layer and gate layer, as shown in FIG. 3C. Lightly doped regions 1013 may be formed using an ion implantation process. Forming the gate insulating layer, a gate layer, and the gate sidewalls may use any conventional processes.

For reason of clarity, the intermediate steps of a method for forming a semiconductor device having through silicon vias will use only two transistors, as shown in subsequent Figures. Still referring to FIG. 3C, processing the semiconductor device further includes:

At step A5, forming a first source region 10151 and a first drain region 10152 in the semiconductor substrate 100. First source and drain regions can be formed using ion implantation.

At step A6, forming a gate terminal 106 on gate layer 1012. Gate terminal 106 may comprise a metal silicide. The structure is further processed with the following steps:

At step A7, forming an interlayer dielectric layer (ILD) 107 on the first surface of semiconductor substrate 100, forming a gate contact opening 108 in the interlayer dielectric layer, shown in FIG. 3D. Other backend of line (BEOL) processes may further be performed, such as forming a metal interconnect structure 120.

The semiconductor device is further processed by bonding a second semiconductor substrate 110 onto the first surface of the semiconductor substrate 100, as shown in FIG. 3E and step A8. At step A8, the first surface of the semiconductor substrate 100 is used as a carrier substrate for second semiconductor substrate 110, which is bonded thereon using an adhesive material layer 109. Adhesive material layer 109 may be an oxide layer or any other suitable materials. Second semiconductor substrate 110 may be any type of semiconductor substrate configured to support semiconductor substrate 100.

At step A9, performing a thinning processing of the semiconductor substrate 100 toward the second surface to expose the stop layer 101 (note this section differs from the original application), as shown in FIG. 3F. The thinning processing is stopped when the stop layer 101 is exposed. In an embodiment, by selecting an appropriate thickness of the semiconductor substrate, the thinning process may not be required.

At step A10, forming a second source portion 1111 in the semiconductor substrate 100, second source portion 1111 is connected to the first source portion 10151, and forming a second drain portion 1112 in the semiconductor substrate 100, that is connected to the first drain portion 10152, as shown in FIG. 3G. The first and second source portions 10151 and 1111 together form a source region of the transistor, the first and second drain portions 10152 and 1112 together form a drain region of the transistor. In an exemplary embodiment, forming the second source portion 1111 and the second drain portion 1112 may include performing an ion implantation on the second surface of semiconductor substrate 100 (process A1001) and submitting the first and second source portions to an annealing process (process A1002). In a specific embodiment, the semiconductor substrate 100 is annealed with a thermal annealing process using laser. The purpose of annealing step A1002 is to diffuse implanted ions in second source/drain portions 1111/1112 further into the first source portion 10151 and to the first drain portion 10152 to obtain good electrical contact between the first and second source and drain regions.

In the above example embodiment, the source and drain regions of the transistor are formed with steps A5 and A10. In other embodiment, the source and drain regions can be formed with the single step A5, using a deep ion implantation performed on the first surface of the semiconductor substrate 100. The source and drain regions are eventually formed when the deep ion implantation reaches the second surface of the semiconductor substrate 100.

At step A11, forming a source connection terminal 1121 and a drain connection terminal 1122 on the second surface of the semiconductor substrate 100. Source connection terminal 1121 is configured to electrically connect with the source region and drain connection terminal 1122 is configured to electrically connect with the drain region of transistor, as shown in FIG. 3G. In an embodiment, source electrode 1121 and drain connection terminal 1122 may be formed of a metal silicide material. In another embodiment, source connection terminal 1121 and drain connection terminal 1122 can be made of copper, aluminum, and other metals or dopant ions (i.e., using ion doping regions as a source connection terminal 1121 and a drain connection terminal 1122).

In an embodiment, body connection terminal 1123 can be concurrently formed with the formation of the source connection terminal 1121 and the drain connection terminal 1122. Body connection terminal 1123 may be a metal silicide, metal or other suitable materials.

At step A12, forming a first dielectric layer 113 on the second surface of the semiconductor substrate 100, as shown in FIG. 3H. First dielectric layer 113 includes a dielectric portion on the second surface of the semiconductor substrate 100 and a dielectric portion embedded in the semiconductor substrate 100, as shown in FIG. 3H. The first dielectric layer 113 may be a silicon oxide layer or other suitable materials. In an exemplary embodiment, step A12 may comprise etching the second surface of the semiconductor substrate 100 to form a first trench and filling the first trench with a dielectric material.

The second surface of the semiconductor substrate 100 is etched through the semiconductor substrate 100 to form a first trench. Typically, the first trench is formed at a region of the TSV (process A1201). Thereafter, the first trench is filled with a dielectric material. A planarizing process is performed on the second surface of the semiconductor substrate to obtain the second dielectric layer 113, as shown in FIG. 3H (process A1202). The dielectric material may be an oxide. The planarizing process may be a chemical mechanical polishing (CMP) process or other planarizing processes as known in the art.

At step A13, forming interlayer dielectric layer (ILD) 114 on the second surface of the semiconductor substrate 100, the interlayer dielectric layer 114 is formed overlying the source connection terminal 1121 and the drain connection terminal 1122, and forming contact openings 1161, 1162 on source connection terminal 1121 and drain connection terminal 1122. Contact opening 1163 may be formed concurrently with the formation of contact openings 1161, 1162.

At step A14, forming through silicon via(s) 115 through the interlayer dielectric layer 114 and the first dielectric layer, as shown in FIG. 3I. Through silicon via(s) 115 is configured to connect elements disposed on the first and second surfaces of the semiconductor substrate 100.

At step A15, removing the second semiconductor substrate 110 that is used as a bearer and the adhesive layer 109, as shown in FIG. 3J (FIG. 1J in Chinese application). The second semiconductor substrate 110 is used only as a bearer for the semiconductor substrate 100 and for the subsequent thinning process. When the complete manufacture of integrated, circuits (referred to as the completion of the functional circuit structure formed on the semiconductor substrate 100 prior to dicing), the second semiconductor substrate 110 and the adhesive layer 109 will be removed.

The embodiments disclosed above are applicable to integrated circuit manufacturing methods including forming transistors and a variety of other components, such as integrated passive devices, MEMS devices, and the likes. Although specific steps, structures and materials may have been described, the present invention may not be limited to these specifics, and others may be substituted as is understood by those skilled in the art.

According to embodiments the present invention, integrated circuit devices may be obtained by using methods described above. By placing the source and drain connection terminals and the gate terminal on opposite sides of the semiconductor substrate 100, capacitive coupling between the source/drain and the gate terminals can effectively be reduced, and the performance of integrated circuits is improved.

FIG. 4 shows a flowchart diagram of a method 400 for manufacturing a semiconductor device according to an embodiment of the present invention. Method 400 includes, at process T101, providing a semiconductor substrate having a first surface of a first depth to form a shallow trench isolation and a second surface opposite of the first surface. The method also includes forming a gate structure configured to form a channel region in the substrate. The gate structure includes an insulating layer on the first surface of the semiconductor substrate, a gate electrode on the gate insulating layer, and gate sidewalk on side surfaces of the gate structure (process T102). The method further includes forming a source region and a drain region in the semiconductor substrate on opposing sides of the channel region (process T103) and forming a source connection terminal and a drain connection terminal on the second surface of the substrate. The source connection terminal is configured to electrically connect with the source region and the drain connection terminal is configured to electrically connect with the drain region (process T104).

FIG. 5 shows a flowchart, diagram of a method 500 for manufacturing a semiconductor device according to another embodiment of the present invention. Method 500 includes the first four processes T101 through T104 of method 400 described, above. Method 500 further includes, at process T105, etching the second surface of the semiconductor substrate in a region outside of the gate structure and the source and drain regions to form a trench. Method 500 also includes, at process T106, filling the trench with a dielectric material and planarizing the filled trench so that the planarized surface of the filled trench is coplanar with the second surface of the semiconductor substrate. In addition, method 500 includes, at process T107, forming through silicon vias (TSV) through the trench to connects elements disposed on the first and second surfaces of the semiconductor substrate.

The invention has been described in terms of specific embodiments. The embodiments described herein are for illustration only and not intended to limit the present invention in any way. Those skilled in the art will appreciate that any modifications and alternatives are possible without departing from the teachings of this invention. Accordingly, the present invention encompasses any modifications and variations falling within the scope of the appended claims.

What is claimed is:

1. A method for manufacturing an integrated circuit device, the method comprising:
   providing a semiconductor substrate having a first surface and a second surface opposite the first surface;
   forming an etch stop layer within the semiconductor substrate at a first depth from the first surface;
   forming a shallow trench isolation in the semiconductor substrate having a second depth from the first surface, the second depth being less than or equal to the first depth;
   forming a gate insulating layer on the first surface of the semiconductor substrate, a gate electrode on the gate insulating layer and gate sidewalls on side surfaces of the gate electrode;
   forming a source region and a drain region in the semiconductor substrate, the source region comprising a first portion adjacent to the gate insulating layer and a second portion extending toward the second surface, and the drain region comprising a first portion adjacent to the gate insulating layer and a second portion extending toward the second surface;
   concurrently forming a source connection terminal on the second surface configured to connect with the source region, a drain connection terminal on the second surface configured to connect with the drain region, and a body terminal on the second surface of the semiconductor substrate between the source connection terminal and the drain connection terminal and directly connected to the semiconductor substrate;
   forming an interlayer dielectric layer overlying the source and drain connection terminals and the body terminal; and
   concurrently forming contact openings through the interlayer dielectric layer directly on the source and drain connection terminals and directly on the body terminal,
   wherein forming the source and drain comprises:
   performing a first ion implantation into the first surface of the semiconductor substrate to form the first portion of the source region and the first portion of the drain region; and
   performing a second ion implantation into the second surface of the semiconductor substrate to form the second portion of the source region and the second portion of the drain region.

2. The method of claim 1, further comprising:
   forming a gate terminal on the gate electrode.

3. The method of claim 1,
   further comprising, after performing the second ion implantation:
   annealing the ion implanted semiconductor substrate to diffuse implanted ions in the second portions into the first portions.

4. The method of claim 1, further comprising:
   bonding a bearer substrate to the first surface of the semiconductor substrate;
   submitting the second surface of the semiconductor substrate to a thinning treatment to remove a portion of the semiconductor substrate to expose a surface of the etch stop layer.

5. The method of claim 1, further comprising:
forming the etch stop layer parallel to the first surface of the semiconductor substrate prior to forming the shallow trench isolation;
thinning the semiconductor substrate from the second surface until the stop layer is exposed.

6. The method of claim 1, further comprising:
forming a first dielectric layer on the second surface of the semiconductor substrate, the first dielectric layer having a first portion disposed on the second surface and a second portion disposed in the semiconductor substrate.

7. The method of claim 6, further comprising:
forming a through silicon via through the interlayer dielectric layer and the first dielectric layer.

8. The method of claim 4, further comprising:
removing the bearer substrate.

9. The method of claim 1, wherein forming the etch stop layer comprises:
injecting oxygen into the semiconductor substrate to the first depth to obtain an oxygen ion layer; and
heating the oxygen ion layer.

\* \* \* \* \*